(12) United States Patent
Cheng et al.

(10) Patent No.: US 10,872,938 B2
(45) Date of Patent: Dec. 22, 2020

(54) ELECTROLUMINESCENT DISPLAY PANEL, METHOD FOR FABRICATING THE SAME AND DISPLAY DEVICE

(71) Applicants: BOE Technology Group Co., Ltd., Beijing (CN); Chengdu BOE Optoelectronics Technology Co., Ltd., Chengdu (CN)

(72) Inventors: Tianyi Cheng, Beijing (CN); Young Yik Ko, Beijing (CN); Weiyun Huang, Beijing (CN); Yue Long, Beijing (CN); Zhenxiao Tong, Beijing (CN); Jingzhe Fang, Beijing (CN); Yujing Piao, Beijing (CN); Shunnv Qian, Beijing (CN)

(73) Assignees: BOE Technology Group Co., Ltd., Beijing (CN); Chengdu BOE Optoelectronics Technology Co., Ltd., Chengdu (CN)

( * ) Notice: Subject to any disclaimer, the term of this patent is extended or adjusted under 35 U.S.C. 154(b) by 31 days.

(21) Appl. No.: 16/116,429

(22) Filed: Aug. 29, 2018

(65) Prior Publication Data
US 2019/0305057 A1    Oct. 3, 2019

(30) Foreign Application Priority Data
Mar. 28, 2018 (CN) .......................... 2018 1 0267233

(51) Int. Cl.
*H01L 27/32* (2006.01)
*H01L 51/50* (2006.01)
*H01L 51/56* (2006.01)

(52) U.S. Cl.
CPC ...... *H01L 27/3246* (2013.01); *H01L 51/5036* (2013.01); *H01L 51/56* (2013.01); *G09G 2320/0233* (2013.01)

(58) Field of Classification Search
CPC . H01L 27/3246; H01L 51/56; H01L 51/5036; H01L 27/3216; H01L 27/326; G09G 2320/0233
See application file for complete search history.

(56) References Cited

U.S. PATENT DOCUMENTS 8,925,480 B2 * 1/2015 Kim ...................... B05C 21/005
118/504
9,696,598 B1 * 7/2017 Long ....................... G02F 1/015
(Continued)

FOREIGN PATENT DOCUMENTS

CN          104505029 A     4/2015
EP            3226301 A1    10/2017

OTHER PUBLICATIONS

Office Action dated Apr. 13, 2020 for Chinese Application No. 201810267233.6.

*Primary Examiner* — Grant Sitta
(74) *Attorney, Agent, or Firm* — Arent Fox LLP; Michael Fainberg

(57) ABSTRACT

The disclosure discloses an electroluminescent display panel, a method for fabricating the same, and a display device. Where the electroluminescent display panel includes: a base substrate; a pixel definition layer located on the base substrate and including a plurality of opening regions for defining sub-pixel light-emitting areas; and light-emitting function layers, which cover the plurality of opening regions in a one-to-one correspondence manner, of sub-pixels; where the plurality of opening regions include normally-shaped opening regions and abnormally-shaped opening regions at an edge of an abnormally-shaped display area; and an area of each of the abnormally-shaped opening regions is smaller than an area of a normally-shaped opening region for defining a sub-pixel having a same light-emitting color.

16 Claims, 4 Drawing Sheets

(56) References Cited

U.S. PATENT DOCUMENTS

| | | | | |
|---|---|---|---|---|
| 9,698,163 B2* | 7/2017 | Park | ................... | H01L 51/5284 |
| 10,102,790 B2* | 10/2018 | Yoon | ................... | G09G 3/2003 |
| 10,651,384 B2* | 5/2020 | Zhao | ..................... | C23C 16/04 |
| 2009/0309813 A1* | 12/2009 | Fujita | ............... | G02F 1/133512 |
| | | | | 345/55 |
| 2010/0020277 A1* | 1/2010 | Morita | ............. | G02F 1/136209 |
| | | | | 349/110 |
| 2011/0175095 A1* | 7/2011 | Kang | ................ | H01L 27/3246 |
| | | | | 257/59 |
| 2014/0070175 A1* | 3/2014 | Kang | .................... | H01L 51/52 |
| | | | | 257/40 |
| 2015/0101536 A1* | 4/2015 | Han | ..................... | C23C 14/042 |
| | | | | 118/721 |
| 2016/0178940 A1* | 6/2016 | Yuan | ................ | G02F 1/133512 |
| | | | | 359/893 |
| 2016/0312354 A1* | 10/2016 | Ko | ........................ | C23C 14/042 |
| 2016/0366747 A1 | 12/2016 | Han et al. | | |
| 2017/0263867 A1* | 9/2017 | Kim | ................... | H01L 51/0011 |
| 2017/0278906 A1* | 9/2017 | Song | ................... | H01L 27/326 |
| 2017/0282212 A1* | 10/2017 | Kang | ................... | B05C 21/005 |
| 2017/0330500 A1* | 11/2017 | Yoon | ................... | G09G 3/2003 |
| 2017/0365822 A1* | 12/2017 | Kim | ....................... | H01L 51/56 |
| 2018/0088726 A1* | 3/2018 | Gwon | ............... | H01L 51/5237 |
| 2018/0337217 A1* | 11/2018 | Zang | ................ | H01L 51/5281 |
| 2018/0342676 A1* | 11/2018 | Zhao | .................... | C23C 16/042 |

* cited by examiner

ELECTROLUMINESCENT DISPLAY PANEL, METHOD FOR FABRICATING THE SAME AND DISPLAY DEVICE

CROSS-REFERENCE TO RELATED APPLICATION

This application claims priority to Chinese Patent Application No. 201810267233.6, filed on Mar. 28, 2018, the content of which is incorporated by reference in the entirety.

TECHNICAL FIELD

This disclosure relates to the field of display technologies, and particularly to an electroluminescent display panel, a method for fabricating the same, and a display device.

DESCRIPTION OF THE RELATED ART

In the related art, screens of common display devices, e.g., a monitor, a TV set, a mobile phone, a tablet computer, etc., are typically regular rectangles. As the display technologies are advancing, an abnormally-shaped display screen will be a popular display design in the future, and a sawtooth of an abnormally-shaped display area will be one of important factors influencing the abnormally-shaped display screen.

SUMMARY

Embodiments of the disclosure provide an electroluminescent display panel, a method for fabricating the same, and a display device.

In one aspect, the embodiments of the disclosure provide an electroluminescent display panel including: a base substrate; a pixel definition layer located on the base substrate and including a plurality of opening regions for defining sub-pixel light-emitting areas; and light-emitting function layers, which cover the plurality of opening regions in a one-to-one correspondence manner, of sub-pixels; wherein the plurality of opening regions include normally-shaped opening regions and abnormally-shaped opening regions at an edge of an abnormally-shaped display area; and an area of each of the abnormally-shaped opening regions is smaller than an area of a normally-shaped opening region for defining a sub-pixel having a same light-emitting color.

In some embodiments, a line connecting edges, which are proximate to a non-display area, of the abnormally-shaped opening regions constitutes a boundary line of the abnormally-shaped display area.

In some embodiments, in sub-pixels with a same light-emitting color, light-emitting function layers corresponding to the normally-shaped opening regions and the abnormally-shaped opening regions have equal areas and are of same shapes.

In some embodiments, the electroluminescent display panel further includes anodes located between the light-emitting function layers and the base substrate; and orthographic projections of the anodes onto the base substrate cover orthographic projections of the plurality of opening regions onto the base substrate in a one-to-one correspondence manner.

In some embodiments, the electroluminescent display panel further includes color resistance layers located on light-emitting sides of the light-emitting function layers; and the light-emitting function layers include white light-emitting layers.

In some embodiments, the light-emitting function layers include monochromatic light-emitting layers.

In another aspect, the embodiments of the disclosure further provide a display device including an electroluminescent display panel, wherein the electroluminescent display panel includes: a base substrate; a pixel definition layer located on the base substrate and including a plurality of opening regions for defining sub-pixel light-emitting areas; and light-emitting function layers, which cover the plurality of opening regions in a one-to-one correspondence manner, of sub-pixels; wherein the plurality of opening regions include normally-shaped opening regions and abnormally-shaped opening regions at an edge of an abnormally-shaped display area; and an area of each of the abnormally-shaped opening regions is smaller than an area of a normally-shaped opening region for defining a sub-pixel having a same light-emitting color.

In some embodiments, a line connecting edges, which are proximate to a non-display area, of the abnormally-shaped opening regions constitutes a boundary line of the abnormally-shaped display area.

In some embodiments, in sub-pixels with a same light-emitting color, light-emitting function layers corresponding to the normally-shaped opening regions and the abnormally-shaped opening regions have equal areas and are of same shapes.

In some embodiments, the electroluminescent display panel further includes anodes located between the light-emitting function layers and the base substrate; and orthographic projections of the anodes onto the base substrate cover orthographic projections of the plurality of opening regions onto the base substrate in a one-to-one correspondence manner.

In some embodiments, the electroluminescent display panel further includes color resistance layers located on light-emitting sides of the light-emitting function layers; and the light-emitting function layers include white light-emitting layers; or the light-emitting function layers include monochromatic light-emitting layers.

In still another aspect, the embodiments of the disclosure further provide a method for fabricating an electroluminescent display panel, the method includes: forming on a base substrate a pixel definition layer with a plurality of opening regions for defining sub-pixel light-emitting areas, wherein the opening regions include normally-shaped opening regions and abnormally-shaped opening regions at an edge of an abnormally-shaped display area, and an area of each of the abnormally-shaped opening regions is smaller than an area of a normally-shaped opening region for defining a sub-pixel having a same light-emitting color; and forming light-emitting function layers, which cover the plurality of opening regions in a one-to-one correspondence manner, of sub-pixels on the pixel definition layer using a fine metal mask.

In some embodiments, forming the light-emitting function layers, which cover the plurality of opening regions in a one-to-one correspondence manner, of the sub-pixels on the pixel definition layer using the fine metal mask includes: forming light-emitting function layers, with equal areas and of same shapes, in sub-pixels with a same light-emitting color using the fine metal mask.

In some embodiments, the light-emitting function layers include white light-emitting layers; and forming the light-emitting function layers, with equal areas and of the same shapes, in the sub-pixels with the same light-emitting color using the fine metal mask includes: forming light-emitting function layers in sub-pixels with respective light-emitting colors concurrently using a same fine metal mask; and the method further includes: forming color resistance layers of respective sub-pixels respectively.

In some embodiments, the light-emitting function layers include monochromatic light-emitting layers; and forming the light-emitting function layers, with equal areas and of the same shapes, in the sub-pixels with the same light-emitting color using the fine metal mask includes: forming light-emitting function layers in sub-pixels with respective light-emitting colors respectively using a plurality of fine metal masks.

In some embodiments, before the pixel definition layer is formed, the method further includes: forming anodes of respective sub-pixels on the base substrate, wherein orthographic projections of the anodes onto the base substrate cover orthographic projections of the plurality of opening regions onto the base substrate in a one-to-one correspondence manner.

In some embodiments, the method further includes: performing light-emission aging on each of the sub-pixels in the electroluminescent display panel for a preset length of time with compensation current greater than a normal display current of said sub-pixel by a preset factor.

In some embodiments, the compensation current is three to five times the normal display current, and the preset length of time ranges from 20 minutes to 30 minutes.

In some embodiments, the light-emitting function layers include monochromatic light-emitting layers; and a length of time during which red sub-pixels are aged is greater than a length of time during which green sub-pixels are aged, and less than a length of time during which blue sub-pixels are aged.

In some embodiments, the red sub-pixels, the blue sub-pixels, and the green sub-pixels are aged concurrently for different lengths of time.

BRIEF DESCRIPTION OF THE DRAWINGS

In order to make the technical solutions according to the embodiments of the disclosure more apparent, the drawings to which a description of the embodiments refers will be briefly introduced below, and apparently the drawings to be described below are merely illustrative of some of the embodiments of the disclosure, and those ordinarily skilled in the art can derive from these drawings other drawings without any inventive effort.

DETAILED DESCRIPTION OF THE EMBODIMENTS

In the related art, a sawtooth display problem of an abnormally-shaped display area can be improved by compensating and adjusting the brightness of pixels corresponding to positions of sawteeth after performing internal operations in a driver integrated chip (IC). This software compensation technique is not well developed, so a demand for designs of various shapes of the abnormally-shaped display area cannot be satisfied. Alternatively a shape of an abnormally-shaped pixel can be changed by changing a shape of a Fine Metal mask (FMM) for fabricating a display panel, but this solution using a FMM with an abnormally-shaped edge has a high cost, and is difficult to implement, and comes with a process which is not easily performed, due to a limited FMM process.

Figure 1:
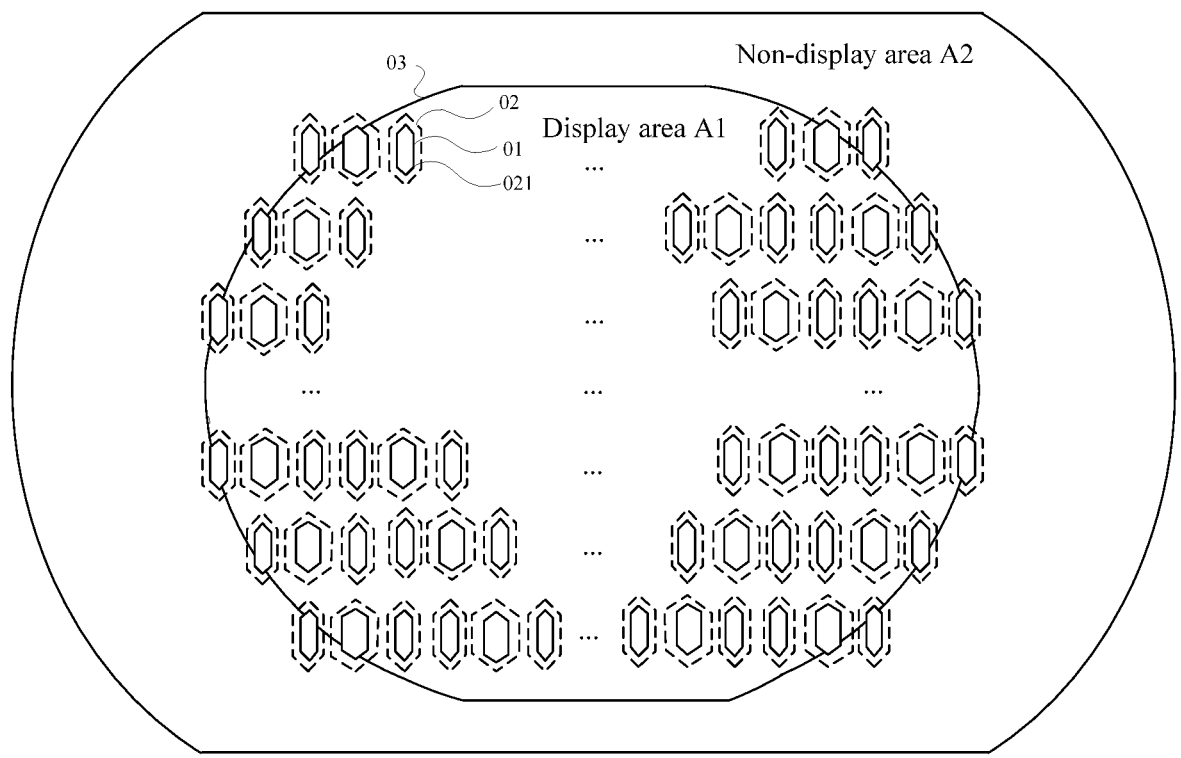
FIG. 1 is a schematic structural diagram of an electroluminescent display panel in the related art in a top view.
Figure 2A:
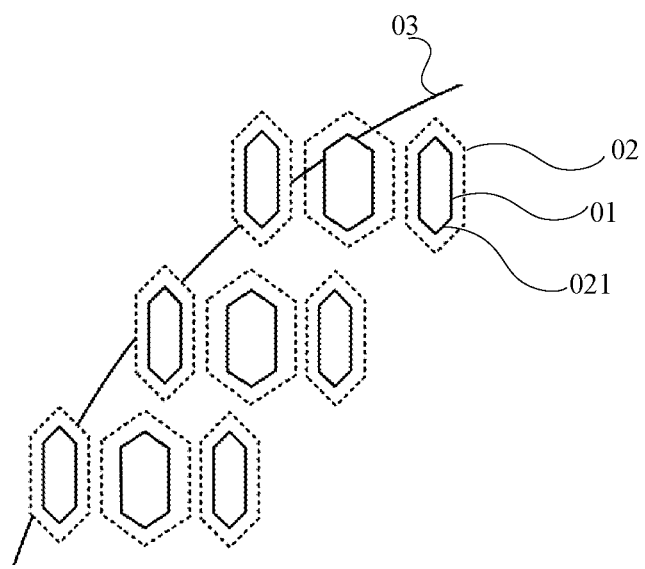
FIG. 2A is a schematic structural diagram of a part of an electroluminescent display panel in the related art in a top view.

For example, as illustrated in FIG. 1 and FIG. 2A, where FIG. 1 illustrates a schematic structural diagram of an electroluminescent display panel in the related art in a top view, where the electroluminescent display panel includes a display area A1 and a non-display area A2 surrounding the display area A1, and the non-display area A2 includes an abnormally-shaped display area, and FIG. 2A illustrates a schematic structural diagram of an abnormally-shaped display area located at a top left corner of the display area A1 of the electroluminescent display panel in FIG. 1 in a top view, where opening regions 01 for defining sub-pixel light-emitting areas of a pixel definition layer are arranged in the abnormally-shaped display area in a stepped pattern, and FIG. 1 and FIG. 2A illustrate a shape of each of the opening regions 01 as a hexagon surrounded by a solid line by way of an example. Correspondingly a hollow region 021 of an FMM for fabricating light-emitting function layers 02 of sub-pixels has the same shape and size as a corresponding opening region 01 of the pixel definition layer, that is, both of them overlap with each other. Since a shadow region occurs in a vapor-deposition process, a pattern of a fabricated light-emitting function layer 02 is larger than a corresponding hollow region 021 of the FMM, and FIG. 1 and FIG. 2A illustrate a pattern of each fabricated light-emitting function layer 02 as a hexagon surrounded by a dotted line. Since the opening regions 01 of the pixel definition layer are arranged in the stepped pattern at an ideal edge 03 of the abnormally-shaped display area, significant sawteeth are displayed in the abnormally-shaped display area if the brightness of sub-pixels is not compensated via an IC. And when the brightness of sub-pixels is compensated and adjusted via the IC, only grayscale brightness of those sub-pixels at an arc edge of the abnormally-shaped display area can be compensated to thereby alleviate the sawteeth from being displayed, while the brightness of sub-pixels in another shape cannot be compensated due to a limited compensation capability of the IC.

Figure 2B:
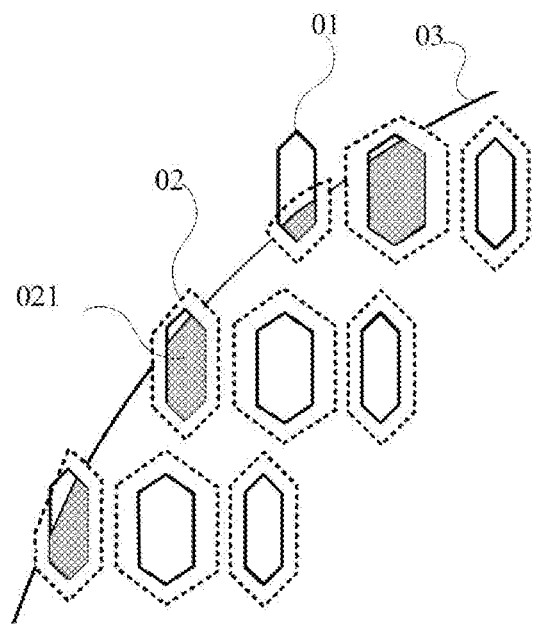
FIG. 2B is another schematic structural diagram of a part of an electroluminescent display panel in the related art in a top view.

As illustrated in FIG. 2B, in order to address the sawtooth display problem of the abnormally-shaped display area above, the hollow regions of the FMM for fabricating the light-emitting function layers 02 of the sub-pixels in the abnormally-shaped display area are changed by changing them along the ideal edge 03 of the abnormally-shaped display area so that no hollow regions are arranged beyond the ideal edge 03, that is, the hollow regions 021 (denoted as regions with grids in the FIG. 2B) of the light-emitting function layers 02 are fabricated to be smaller than the corresponding opening regions 01 of the pixel definition layer at the ideal edge 03 of the abnormally-shaped display area. Since a shadow region occurs in a vapor-deposition process, shadow regions may exit in the opening regions 01 larger than the hollow regions 021, and the thicknesses of the light-emitting function layers 02 in the shadow regions are slightly shortened, thus degrading the light-emitting efficiency of the materials, so that the brightness of the sub-pixels in the abnormally-shaped display area may become uncontrollable, thus resulting in a display defect. Furthermore as the vapor-deposition process is advancing constantly, the materials of the light-emitting function layers may be accumulated on the FMM, so that a non-uniform force may be applied to the FMM, thus hindering the FMM from being deployed in a network pattern, and shortening the service lifetime of the FMM.

Accordingly it is highly desirable for those skilled in the art to provide an efficient approach to address the sawtooth display problem of the abnormally-shaped display area.

In order to make the objects, technical solutions, and advantages of the disclosure more apparent, the disclosure will be described below in further details with reference to the drawings, and apparently the embodiments to be described are only a part but not all of the embodiments of the disclosure. Based upon the embodiments here of the disclosure, all the other embodiments which can occur to those ordinarily skilled in the art without any inventive effort shall fall into the claimed scope of the disclosure.

The shapes and sizes of respective components in the drawings are not intended to reflect any real proportion, but only intended to illustrate the content of the disclosure.

Figure 3:
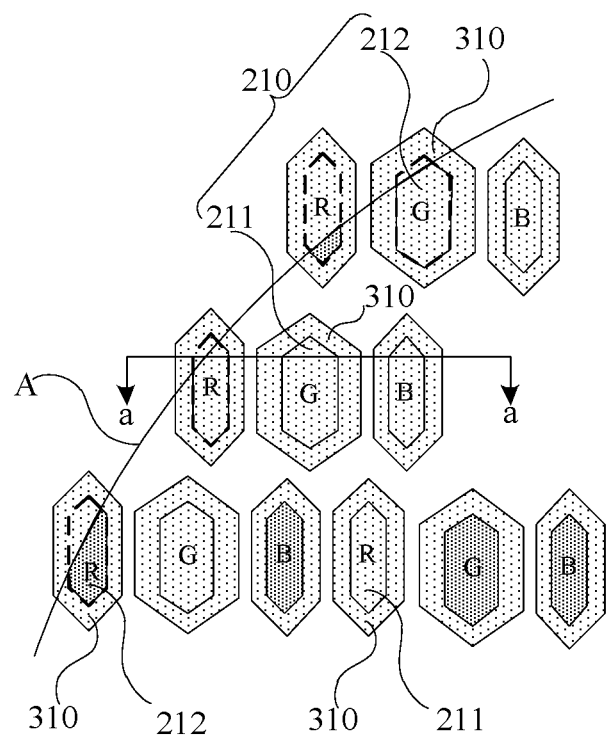
FIG. 3 is a schematic structural diagram of a part of an electroluminescent display panel according to the embodiments of the disclosure in a top view.
Figure 4:
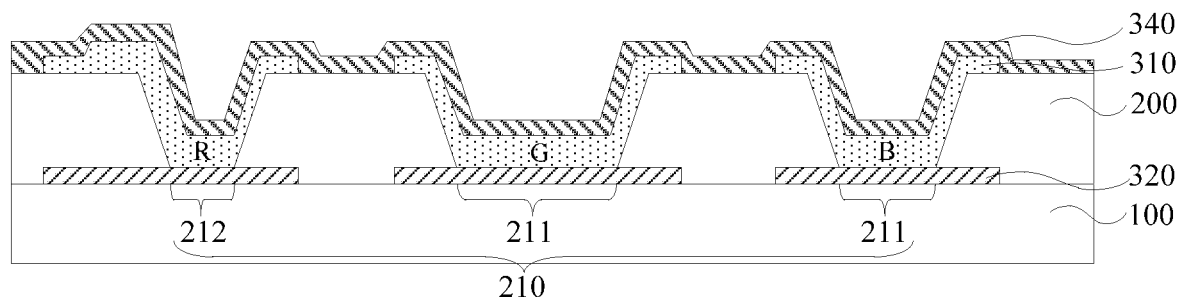
FIG. 4 is a sectional view along a line "aa" in FIG. 3.
Figure 5:
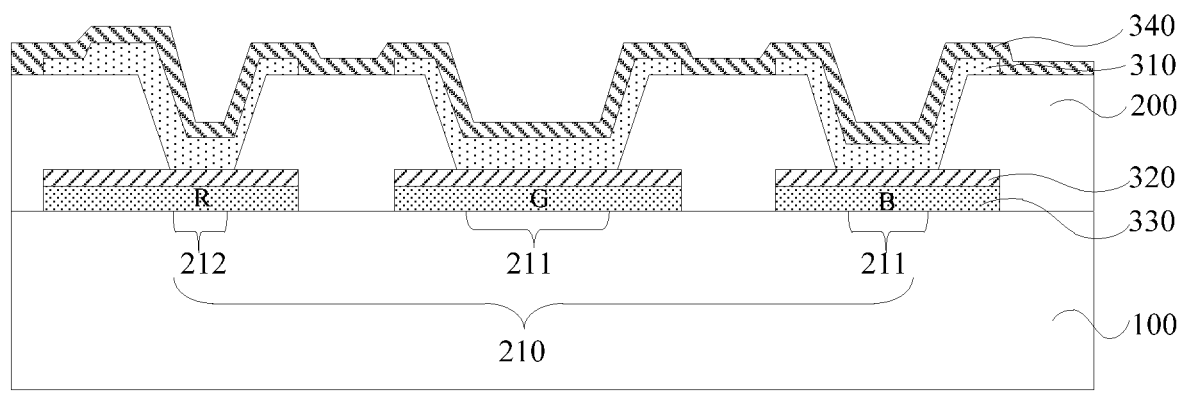
FIG. 5 is another sectional view along the line "aa" in FIG. 3.

As illustrated in FIG. 3 to FIG. 5, the embodiments of the disclosure provide an electroluminescent display panel, where FIG. 4 and FIG. 5 are two sectional views along a line "aa" in FIG. 3, and the electroluminescent display panel includes: a base substrate 100; a pixel definition layer 200 located on the base substrate 100 and including a plurality of opening regions 210 for defining sub-pixel light-emitting areas; and light-emitting function layers 310, which cover the plurality of opening regions 210 in a one-to-one correspondence manner, of sub-pixels.

Where the plurality of opening regions 210 include normally-shaped opening regions 211 and abnormally-shaped opening regions 212 at an edge of an abnormally-shaped display area of the electroluminescent display panel; and an area of each of the abnormally-shaped opening regions 212 is smaller than an area of a normally-shaped opening region 211 for defining a sub-pixel having a same light-emitting color.

For example, as illustrated in FIG. 3, Red (R), Green (G), and Blue (B) represent light-emitting colors of the sub-pixels respectively, and for an abnormally-shaped opening region 212 which defines a sub-pixel with a light-emitting color of R, an area thereof is smaller than an area of a normally-shaped opening region 211 that defines a sub-pixel with a same light-emitting color of R; and for an abnormally-shaped opening region 212 which defines a sub-pixel with a light-emitting color of G, an area thereof is smaller than an area of a normally-shaped opening region 211 that defines a sub-pixel with a same light-emitting color of G It shall be noted that, R, G, and B are only illustrated by way of an example, but the light-emitting colors of the sub-pixels will not be limited to the colors above in a practical application.

In some embodiments, the light-emitting function layers 310 cover the plurality of opening regions 210 in a one-to-one correspondence manner completely.

In some embodiments, in the electroluminescent display panel above according to the embodiments of the disclosure, since the opening regions 210 of the pixel definition layer define the shapes of the sub-pixel light-emitting areas, the shapes of the opening regions at the edge of the abnormally-shaped display area are changed so that the areas of the abnormally-shaped opening regions 212 at the edge of the abnormally-shaped display area are smaller than the areas of the corresponding normally-shaped opening regions 211 for defining sub-pixels with the same light-emitting colors as sub-pixels defined by said abnormally-shaped opening regions, and the abnormally-shaped opening regions 212 are changed along an ideal edge A of the abnormally-shaped display area so that no opening regions are arranged beyond the ideal edge A, thus eliminating sawteeth displayed in the abnormally-shaped display area. Furthermore the light-emitting function layers 310 of the sub-pixels completely cover the plurality of opening regions 210 in a one-to-one correspondence manner, so that shadow regions with uncontrollable thicknesses occurring during a vapor-deposition process will be located outside the abnormally-shaped opening regions 212 instead of influencing the brightness of the sub-pixels in the abnormally-shaped display area, which would otherwise have resulted in a display defect.

In some embodiments, in the electroluminescent display panel above according to the embodiments of the disclosure, as illustrated in FIG. 3, a line connecting edges, which are proximate to a non-display area of the electroluminescent display panel, of the abnormally-shaped opening regions 212 constitutes a boundary line of the abnormally-shaped display area, i.e., the ideal edge A in FIG. 3, so that the edges of the sub-pixel light-emitting areas at the edge of the abnormally-shaped display area agrees with the edge of the abnormally-shaped display area to thereby further eliminate sawteeth displayed in the abnormally-shaped display area.

In some embodiments, in the electroluminescent display panel above according to the embodiments of the disclosure, as illustrated in FIG. 3, in sub-pixels with a same light-emitting color, light-emitting function layers 310 corresponding to the normally-shaped opening regions 211 and the abnormally-shaped opening regions 212 have equal areas and are of same shapes, that is, both the areas and the shapes of the light-emitting function layers 310 of the sub-pixels with the same light-emitting color are the same. For example, as illustrated in FIG. 3, for sub-pixels with a light-emitting color of G, light-emitting function layers 310 corresponding to the normally-shaped opening regions 211 and the abnormally-shaped opening regions 212 have equal areas and are of same shapes. Therefore, the shapes of the hollow regions of the FMM can be avoided from being changed, that is, the hollow regions (denoted by the dotted lines in FIG. 3) of the FMM at the ideal edge A will be larger than the corresponding abnormally-shaped opening regions 212, so on one hand, the structure of the FMM can be avoided from being adjusted, so that as the materials of the light-emitting function layers are being accumulated on the FMM, no non-uniform force will be applied to the FMM, and thus neither the FMM will be hindered from being deployed in a network pattern, nor the service lifetime of the FMM will be shortened; and on the other hand, the shadow regions will be located outside the abnormally-shaped opening regions 212 instead of influencing the brightness of the sub-pixels in the abnormally-shaped display area, which would otherwise have resulted in a display defect.

In some embodiments, in the electroluminescent display panel above according to the embodiments of the disclosure, the areas and/or the shapes of the light-emitting function layers 310 of the sub-pixels with the same light-emitting color can alternatively be designed differently, although the embodiments of the disclosure will not be limited thereto, as long as the light-emitting function layers 310 of the sub-pixels cover the plurality of opening regions 210 in a one-to-one correspondence manner.

In some embodiments, in the electroluminescent display panel above according to the embodiments of the disclosure, as illustrated in FIG. 4, the electroluminescent display panel further includes anodes 320 located between the light-emitting function layers 310 and the base substrate 100; and orthographic projections of the anodes 320 onto the base substrate 100 cover orthographic projections of the plurality of opening regions onto the base substrate 100 in a one-to-one correspondence manner.

In some embodiments, in a same sub-pixel, orthographic projections of an anode 320 and a light-emitting function layer 310 onto the base substrate 100 overlap with each other. And in some embodiments, orthographic projections of the anodes 320 onto the base substrate 100 completely cover orthographic projections of the plurality of opening regions onto the base substrate 100 in a one-to-one correspondence manner.

In some embodiments, when the light-emitting function layers 310 of the sub-pixels with the same light-emitting color have equal areas and same shapes, the anodes 320 of the sub-pixels with the same light-emitting color will also have equal areas and same shapes; and when the light-emitting function layers 310 of the sub-pixels with the same light-emitting color have unequal areas and different shapes, the anodes 320 of the sub-pixels with the same light-emitting color will also have unequal areas and different shapes. Of course, the shapes of the anodes 320 can alternatively be designed as needed in practical as long as they cover the opening regions 210 of the pixel definition layer to thereby guarantee the sub-pixel light-emitting areas.

In some embodiments, in the electroluminescent display panel above according to the embodiments of the disclosure, FIG. 3 only illustrates the shapes and the areas of the light-emitting areas of the sub-pixels with different light-emitting colors by way of an example, but their shapes and areas will not be limited thereto, and can be designed as needed in a practical application.

In some embodiments, in the electroluminescent display panel above according to the embodiments of the disclosure, a light-emitting mode of the sub-pixels is a white light plus color resistance mode, and at this time, as illustrated in FIG. 5, the electroluminescent display panel further includes color resistance layers 330 located on light-emitting sides of the light-emitting function layers 310, and the light-emitting function layers 310 include white light-emitting layers. At this time, the light-emitting function layers 310 of the sub-pixels with different light-emitting colors can be fabricated via the same FMM. The white light-emitting layers are arranged to thereby avoid the light-emitting efficiencies of materials of different monochromatic light-emitting layers from being different from each other, and an image from being displayed non-uniformly as the light-emitting efficiencies of the materials are dropping differently. FIG. 5 only illustrates the electroluminescent display panel which is a bottom-emitting electroluminescent display panel by way of an example, but the embodiments of the disclosure can also be applicable to a top-emitting electroluminescent display panel, although the embodiments of the disclosure will not be limited thereto.

In some embodiments, in the electroluminescent display panel above according to the embodiments of the disclosure, the light-emitting mode of the sub-pixels is alternatively a monochromatic light mode, and at this time, as illustrated in FIG. 4, the light-emitting function layers 310 include monochromatic light-emitting layers, e.g., Red (R) light-emitting layers, Green (G) light-emitting layers, and Blue (B) light-emitting layers. At this time, the light-emitting function layers 310 of the sub-pixels with different light-emitting colors can be fabricated respectively via different FMMs. No color resistance will be arranged, thus improving the light-emitting efficiency of the display panel.

In some embodiments, in the electroluminescent display panel above according to the embodiments of the disclosure, each of the sub-pixels can include a cathode 340 and other layers in addition to a light-emitting function layer 310, an anode 320, and a color resistance layer 330 above, although a repeated description thereof will be omitted here. Where each of the light-emitting function layers 310 is a composite layer further including an electron transport layer, a hole blocking layer, a hole transport layer, an electron blocking layer, and other layers in addition to a light-emitting layer, although a repeated description thereof will be omitted here.

Based upon the same inventive concept, the embodiments of the disclosure further provide a method for fabricating an electroluminescent display panel, and since the method addresses the problem under a similar principle to the electroluminescent display panel above, reference can be made to the implementation of the electroluminescent display panel for an implementation of the method, and a repeated description thereof will be omitted here.

In some embodiments, the method for fabricating the electroluminescent display panel according to the embodiments of the disclosure includes the following operations.

Forming on a base substrate a pixel definition layer with a plurality of opening regions for defining sub-pixel light-emitting areas, where the opening regions include normally-shaped opening regions and abnormally-shaped opening regions at an edge of an abnormally-shaped display area, and an area of each of the abnormally-shaped opening regions is smaller than an area of a normally-shaped opening region for defining a sub-pixel having a same light-emitting color.

Forming light-emitting function layers, which cover the plurality of opening regions in a one-to-one correspondence manner, of sub-pixels on the pixel definition layer using a Fine Metal Mask (FMM).

In some embodiments, the light-emitting function layers cover the plurality of opening regions in a one-to-one correspondence manner completely.

In some embodiments, in the method above according to the embodiments of the disclosure, since the opening regions of the pixel definition layer define the shapes of the sub-pixel light-emitting areas, the shapes of the opening regions at the edge of the abnormally-shaped display area are changed so that the areas of the abnormally-shaped opening regions at the edge of the abnormally-shaped display area are smaller than the areas of the corresponding normally-shaped opening regions for defining sub-pixels with the same light-emitting colors, and the edges of the sub-pixel light-emitting areas at the edge of the abnormally-shaped display area agrees with the edge of the abnormally-shaped display area, that is, the abnormally-shaped opening regions are changed along an ideal edge of the abnormally-shaped display area so that no opening regions are arranged beyond the ideal edge, thus eliminating sawteeth displayed in the abnormally-shaped display area. Furthermore the light-emitting function layers of the sub-pixels completely cover the plurality of opening regions in a one-to-one correspondence manner, so that shadow regions with uncontrollable thicknesses occurring during a vapor-deposition process will be located outside the abnormally-shaped opening regions instead of influencing the brightness of the sub-pixels in the abnormally-shaped display area, which would otherwise resulted in a display defect.

In some embodiments, in the method above according to the embodiments of the disclosure, forming the light-emitting function layers, which cover the plurality of opening regions in a one-to-one correspondence manner, of the sub-pixels on the pixel definition layer using the fine metal mask includes: forming light-emitting function layers, with equal areas and of same shapes, in sub-pixels with a same light-emitting color using the fine metal mask.

In some embodiments, the shapes of the respective fabricated light-emitting function layers, in the sub-pixels with the same light-emitting color, corresponding to the normally-shaped opening regions and the abnormally-shaped opening regions are the same, so that the shapes of hollow regions of the FMM can be avoided from being changed, that is, the hollow regions of the FMM at the ideal edge will be larger than the corresponding abnormally-shaped opening regions, so on one hand, the structure of the FMM can be avoided from being adjusted, so that as the materials of the light-emitting function layers are being accumulated on the FMM, no non-uniform force will be applied to the FMM, and thus neither the FMM will be hindered from being deployed in a network pattern, nor the service lifetime of the FMM will be shortened; and on the other hand, the shadow regions will be located outside the abnormally-shaped opening regions instead of influencing the brightness of the sub-pixels in the abnormally-shaped display area, which would otherwise have resulted in a display defect.

In some embodiments, in the method above according to the embodiments of the disclosure, when a light-emitting mode of the sub-pixels is a white light plus color resistance mode, the light-emitting function layers include white light-emitting layers.

Correspondingly forming the light-emitting function layers, with equal areas and of the same shapes, in the sub-pixels with the same light-emitting color using the fine metal mask includes: forming light-emitting function layers in sub-pixels with respective light-emitting colors concurrently using a same fine metal mask. And the method further includes: forming color resistance layers of respective sub-pixels respectively. In some embodiments, when the method is applied to a bottom-emitting electroluminescent display panel, the color resistance layers of the respective sub-pixels are formed respectively before the light-emitting function layers are formed; and when the method is applied to a top-emitting electroluminescent display panel, the color resistance layers of the respective sub-pixels are formed respectively after the light-emitting function layers are formed.

In some embodiments, the light-emitting function layers of the sub-pixels with different light-emitting colors are fabricated using the same FMM to thereby reduce the number of process steps, and improve the efficiency of production. Furthermore the white light-emitting layers are arranged to thereby avoid the light-emitting efficiencies of the materials of different monochromatic light-emitting layers from being different from each other, and an image from being displayed non-uniformly as the light-emitting efficiencies of the materials are dropping differently.

In some embodiments, in the method above according to the embodiments of the disclosure, when a light-emitting mode of the sub-pixels is a monochromatic light mode, the light-emitting function layers include monochromatic light-emitting layers.

Correspondingly forming the light-emitting function layers, with equal areas and of the same shapes, in the sub-pixels with the same light-emitting color using the fine metal mask includes: forming the light-emitting function layers in sub-pixels with respective light-emitting colors respectively using a plurality of fine metal masks.

In some embodiments, the light-emitting function layers of the sub-pixels with different light-emitting colors are fabricated respectively using the plurality of fine metal masks, so that color resistances can be avoided from being arranged, to thereby improve the light-emitting efficiency of the display panel.

In some embodiments, in the method above according to the embodiments of the disclosure, before the pixel definition layer is formed, the method further includes: forming anodes of respective sub-pixels on the base substrate, where orthographic projections of the anodes onto the base substrate cover orthographic projections of the plurality of opening regions onto the base substrate in a one-to-one correspondence manner.

In some embodiments, in a same sub-pixel, orthographic projections of an anode and a light-emitting function layer onto the base substrate overlap with each other. And in some embodiments, orthographic projections of the anodes onto the base substrate completely cover orthographic projections of the plurality of opening regions onto the base substrate 100 in a one-to-one correspondence manner.

In some embodiments, in the method above according to the embodiments of the disclosure, since an area of each of the abnormally-shaped opening regions is smaller than an area of a normally-shaped opening region for defining a sub-pixel having a same light-emitting color as a sub-pixel defined by said abnormally-shaped opening region, an area of a sub-pixel light-emitting area at the edge of the abnormally-shaped display area in the fabricated electroluminescent display panel will also be smaller than an area of a sub-pixel light-emitting area in the other region of the abnormally-shaped display area, with the same light-emitting color as said sub-pixel light-emitting area at the edge of the abnormally-shaped display area. And the electroluminescent display panel provides the respective sub-pixels with uniform drive current, so that the current densities of the sub-pixels at the edge of the abnormally-shaped display area are higher per unit area, thus resulting abnormal brightness of light emitted there. Furthermore the service lifetime of the materials of the light-emitting function layers may be shortened more rapidly due to the higher current, and after they have emitted light constantly for a long period of time, e.g., several months or half a year, the brightness of light emitted by the sub-pixels at the edge of the abnormally-shaped display area will be lower than the brightness of light emitted by the normal sub-pixels, thus resulting in a display defect.

Figure 6:
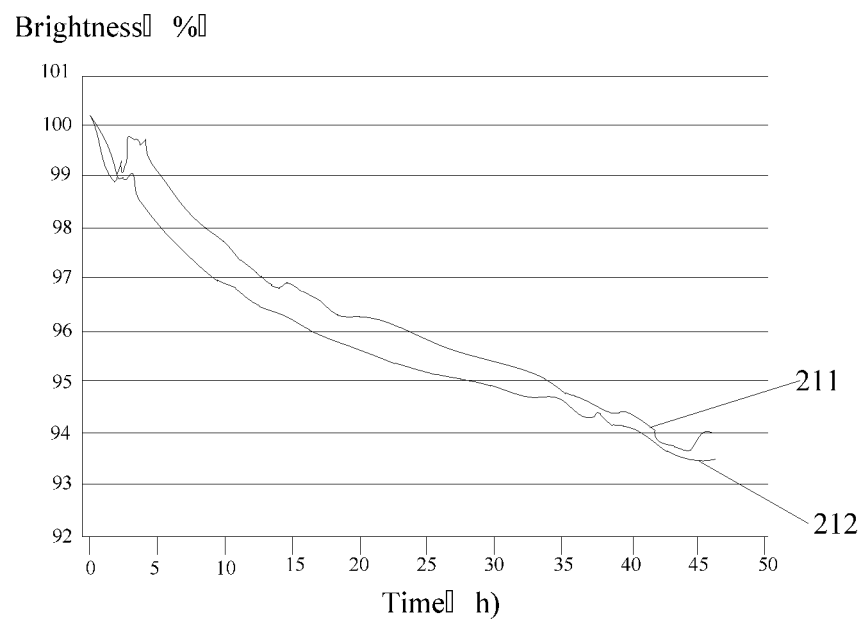
FIG. 6 is light-emitting attenuation curves of sub-pixel light-emitting areas with different areas in the electroluminescent display panel according to the embodiments of the disclosure.

In view of this, the applicant proposes that the materials of the light-emitting function layers are aged in advance at higher current in a light-emission aging (L-aging) process to thereby remove such an early stage that the brightness of the materials of the light-emitting function layers is dropping rapidly at a non-uniform rate. Where the service lifetime of the L-aged materials can be shortened at a moderate rate. Furthermore as illustrated in FIG. 6, the current densities of the abnormally-shaped opening regions 212 with smaller areas are higher, so the service lifetime of the L-aged materials thereof is shortened more rapidly; and the current densities of the normally-shaped opening regions 211 with larger areas are lower, so the service lifetime of the L-aged materials thereof is shortened more slowly.

Accordingly, in some embodiments, in the method above according to the embodiments of the disclosure, the method furthers include: performing L-aging on each of the sub-pixels in the fabricated electroluminescent display panel for a preset length of time with a compensation current greater than a normal display current of said sub-pixel by a preset factor.

For example, in the method above according to the embodiments of the disclosure, the compensation current is three to five times the normal display current, and the preset length of time ranges from 20 minutes to 30 minutes.

In some embodiments, L-aging is typically performed after the electroluminescent display panel is finished and before it is delivered, where the service lifetime of the aged materials is reduced at a moderate rate, the current densities of the abnormally-shaped opening regions 212 with smaller areas are higher, and the light-emitting efficiencies of the L-aged materials are degraded, so the difference thereof in current density from the corresponding normally-shaped opening regions 21 can be compensated to thereby guarantee the uniformity of display brightness.

Figure 7:
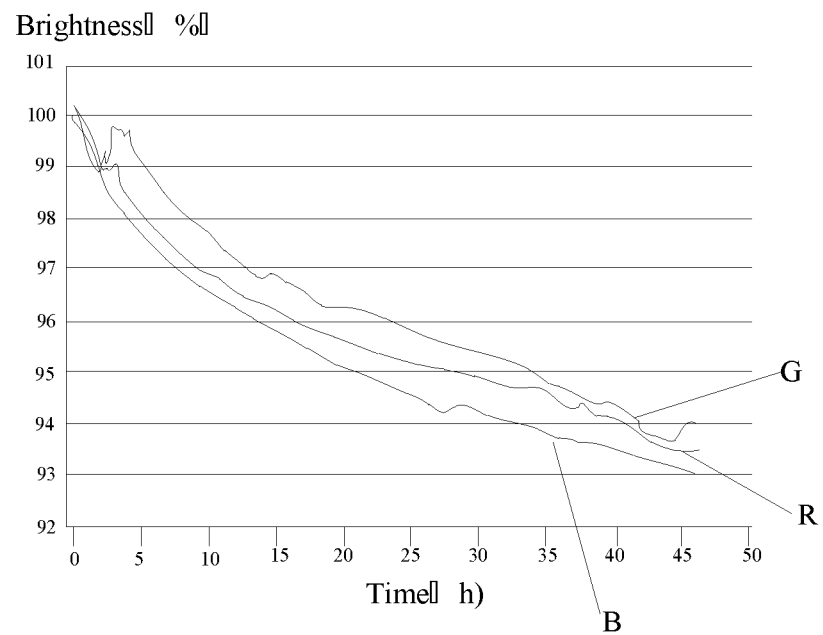
FIG. 7 is light-emitting attenuation curves of sub-pixel light-emitting areas with different light-emitting colors in the electroluminescent display panel according to the embodiments of the disclosure.

In some embodiments, in the method above according to the embodiments of the disclosure, when a light-emitting mode of the sub-pixels is a monochromatic light mode, that is, the light-emitting function layers include monochromatic light-emitting layers, as illustrated in FIG. 7, the light-emitting efficiencies of the materials of the monochromatic light-emitting layers, and the rates at which the service lifetime thereof is reduced are different from each other, so different aging parameters can be specified for the sub-pixels with different light-emitting colors. For example, the length of time for which the red sub-pixels are aged is greater than the length of time for which the green sub-pixels are aged, and less than the length of time for which the blue sub-pixels are aged. That is, under the same condition, the blue sub-pixels are aged for the longest period of time, and the green sub-pixels are aged for the shortest period of time.

In some embodiments, in the method above according to the embodiments of the disclosure, in order to improve the efficiency of L-aging, the red sub-pixels, the blue sub-pixels, and the green sub-pixels can be aged concurrently for different lengths of time. That is, L-aging of the red sub-pixels, L-aging of the blue sub-pixels, and L-aging of the green sub-pixels start at the same time, and L-aging of the green sub-pixels with the shortest L-aging period of time is the first to end, and L-aging of the blue sub-pixels with the longest L-aging period of time is the last to end.

Based upon the same inventive concept, the embodiments of the disclosure further provide a display device including the electroluminescent display panel above according to the embodiments of the disclosure. The display device can be a mobile phone, a tablet computer, a TV set, a monitor, a notebook computer, a digital photo frame, a navigator, or any other product or component capable of displaying. Reference can be made to the embodiments of the electroluminescent display panel above for the embodiments of the display device, so a repeated description thereof will be omitted here.

In the electroluminescent display panel, the method for fabricating the same, and the display device above according to the embodiments of the disclosure, since the opening regions of the pixel definition layer define the shapes of the sub-pixel light-emitting areas, the shapes of the opening regions at the edge of the abnormally-shaped display area are changed so that the areas of the abnormally-shaped opening regions at the edge of the abnormally-shaped display area are smaller than the areas of the corresponding normally-shaped opening regions for defining sub-pixels with the same light-emitting colors, and the abnormally-shaped opening regions are changed along an ideal edge of the abnormally-shaped display area so that no opening regions are arranged beyond the ideal edge, thus eliminating sawteeth displayed in the abnormally-shaped display area. Furthermore the light-emitting function layers of the sub-pixels completely cover respective corresponding opening regions, so that shadow regions with uncontrollable thicknesses occurring during a vapor-deposition process will be located outside the abnormally-shaped opening regions instead of influencing the brightness of the sub-pixels in the abnormally-shaped display area, which would otherwise have resulted in a display defect.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. An electroluminescent display panel, comprising:
   a base substrate;
   a pixel definition layer located on the base substrate and comprising a plurality of opening regions for defining light-emitting areas of sub-pixels; and
   light-emitting function layers, which cover the plurality of opening regions in a one-to-one correspondence manner, of the sub-pixels;
   wherein the plurality of opening regions comprise:
      normally-shaped opening regions; and
      abnormally-shaped opening regions at an edge of an abnormally-shaped display area;
   a line connecting edges, which are proximate to a non-display area, of the abnormally-shaped opening regions constitutes a boundary line of the abnormally-shaped display area;
   an area of an abnormally-shaped opening region for defining a sub-pixel having a light-emitting color is smaller than an area of a normally-shaped opening region for defining a sub-pixel having the light-emitting color;
   a light-emitting function layer corresponding to the abnormally-shaped opening region and a light-emitting function layer corresponding to the normally-shaped opening region have equal areas and are of same shape; and
   the area of the abnormally-shaped opening region is smaller than an area of a hollow region of a fine metal mask (FMM) for fabricating the light-emitting function layer corresponding to the abnormally-shaped opening region.

2. The electroluminescent display panel according to claim 1, wherein the electroluminescent display panel further comprises anodes located between the light-emitting function layers and the base substrate; and
   orthographic projections of the anodes onto the base substrate cover orthographic projections of the plurality of opening regions onto the base substrate in a one-to-one correspondence manner.

3. The electroluminescent display panel according to claim 1, wherein the electroluminescent display panel further comprises color resistance layers located on light-emitting sides of the light-emitting function layers, and the light-emitting function layers comprise white light-emitting layers.

4. The electroluminescent display panel according to claim 1, wherein the light-emitting function layers comprise monochromatic light-emitting layers.

5. A display device, comprising an electroluminescent display panel, wherein the electroluminescent display panel comprises:
   a base substrate;
   a pixel definition layer located on the base substrate and comprising a plurality of opening regions for defining light-emitting areas of sub-pixels; and
   light-emitting function layers, which cover the plurality of opening regions in a one-to-one correspondence manner, of the sub-pixels;
   wherein the plurality of opening regions comprise:
      normally-shaped opening regions; and
      abnormally-shaped opening regions at an edge of an abnormally-shaped display area;
   a line connecting edges, which are proximate to a non-display area, of the abnormally-shaped opening regions constitutes a boundary line of the abnormally-shaped display area;
   an area of an abnormally-shaped opening region for defining a sub-pixel having a light-emitting color is smaller than an area of a normally-shaped opening region for defining a sub-pixel having the light-emitting color;
   a light-emitting function layer corresponding to the abnormally-shaped opening region and a light-emitting function layer corresponding to the normally-shaped opening region have equal areas and are of same shape; and
   the area of the abnormally-shaped opening region is smaller than an area of a hollow region of a fine metal mask (FMM) for fabricating the light-emitting function layer corresponding to the abnormally-shaped opening region.

6. The display device according to claim 5, wherein the electroluminescent display panel further comprises anodes located between the light-emitting function layers and the base substrate; and
   orthographic projections of the anodes onto the base substrate cover orthographic projections of the plurality of opening regions onto the base substrate in a one-to-one correspondence manner.

7. The display device according to claim 5, wherein the electroluminescent display panel further comprises color resistance layers located on light-emitting sides of the light-emitting function layers; and the light-emitting function layers comprise white light-emitting layers; or the light-emitting function layers comprise monochromatic light-emitting layers.

8. A method for fabricating an electroluminescent display panel, the method comprising:
   forming on a base substrate a pixel definition layer with a plurality of opening regions for defining light-emitting areas of sub-pixels, wherein the opening regions comprise normally-shaped opening regions and abnormally-shaped opening regions at an edge of an abnormally-shaped display area, and an area of an abnormally-shaped opening region for defining a sub-pixel having a light-emitting color is smaller than an area of a normally-shaped opening region for defining a sub-pixel having the light-emitting color; and
   forming light-emitting function layers, which cover the plurality of opening regions in a one-to-one correspondence manner, of the sub-pixels on the pixel definition layer using a fine metal mask (FMM), wherein a light-emitting function layer corresponding to the abnormally-shaped opening region and a light-emitting function layer corresponding to the normally-shaped opening region have equal areas and are of same shape, and wherein the area of the abnormally-shaped opening region is smaller than an area of a hollow region of the FMM for fabricating the light-emitting function layer corresponding to the abnormally-shaped opening region.

9. The method according to claim 8, wherein forming the light-emitting function layers, which cover the plurality of opening regions in a one-to-one correspondence manner, of the sub-pixels on the pixel definition layer using the fine metal mask comprises:
   forming light-emitting function layers, with equal areas and of same shapes, in sub-pixels with a same light-emitting color using the fine metal mask.

10. The method according to claim 9, wherein the light-emitting function layers comprise white light-emitting layers; and forming the light-emitting function layers, with equal areas and of the same shapes, in the sub-pixels with the same light-emitting color using the fine metal mask comprises:
    forming light-emitting function layers in sub-pixels with respective light-emitting colors concurrently using a same fine metal mask; and
    the method further comprises:
    forming color resistance layers of respective sub-pixels respectively.

11. The method according to claim 9, wherein the light-emitting function layers comprise monochromatic light-emitting layers; and forming the light-emitting function layers, with equal areas and of the same shapes, in the sub-pixels with the same light-emitting color using the fine metal mask comprises:
    forming light-emitting function layers in sub-pixels with respective light-emitting colors respectively using a plurality of fine metal masks.

12. The method according to claim 8, wherein before the pixel definition layer is formed, the method further comprises:
    forming anodes of respective sub-pixels on the base substrate, wherein orthographic projections of the anodes onto the base substrate cover orthographic projections of the plurality of opening regions onto the base substrate in a one-to-one correspondence manner.

13. The method according to claim 8, wherein the method further comprises:
    performing light-emission aging on each of the sub-pixels in the electroluminescent display panel for a preset length of time with a compensation current greater than a normal display current of said sub-pixel by a preset factor.

14. The method according to claim 13, wherein the compensation current is three to five times the normal display current, and the preset length of time ranges from 20 minutes to 30 minutes.

15. The method according to claim 13, wherein the light-emitting function layers comprise monochromatic light-emitting layers; and
    a length of time during which red sub-pixels are aged is greater than a length of time during which green sub-pixels are aged, and less than a length of time during which blue sub-pixels are aged.

16. The method according to claim 15, wherein the red sub-pixels, the blue sub-pixels, and the green sub-pixels are aged concurrently for different lengths of time.

\* \* \* \* \*